(12) United States Patent
Jayabalan et al.

(10) Patent No.: US 7,392,143 B2
(45) Date of Patent: Jun. 24, 2008

(54) MONITORING AND FAULT DIAGNOSIS OF SINGLE- AND MULTI-CONVERTER POWER SYSTEMS

(75) Inventors: Ranjit Jayabalan, Danvers, MA (US); Babak Fahimi, Arlington, TX (US)

(73) Assignee: The University of Texas System Board of Regents, Austin, TX (US)

( * ) Notice: Subject to any disclaimer, the term of this patent is extended or adjusted under 35 U.S.C. 154(b) by 0 days.

(21) Appl. No.: 11/491,643

(22) Filed: Jul. 24, 2006

(65) Prior Publication Data

US 2007/0219749 A1 Sep. 20, 2007

Related U.S. Application Data

(60) Provisional application No. 60/782,077, filed on Mar. 14, 2006.

(51) Int. Cl.
G01R 21/00 (2006.01)
G06F 17/18 (2006.01)
G06F 11/30 (2006.01)

(52) U.S. Cl. ............... 702/60; 702/179; 702/185
(58) Field of Classification Search .......... 702/60, 702/59, 58, 179, 185; 307/64, 85, 86; 363/65, 363/71; 324/411, 416
See application file for complete search history.

(56) References Cited

U.S. PATENT DOCUMENTS 4,471,308 A * 9/1984 Gable et al. ............... 324/416
6,035,261 A * 3/2000 Carpenter et al. ......... 702/59
7,243,048 B2 * 7/2007 Foslien et al. ............. 702/185

OTHER PUBLICATIONS

Jayabalan, R., Fahimi, B., "Monitoring and Fault Diagnosis of DC-DC Multistage Converter for Hybrid Electric Vehicles," SDEMPED 2005, Sep. 7-9, 2005, 6 pp., Vienna, Austria.

Jayabalan, R., Fahimi, B., "Monitoring and Fault Diagnosis of Cascaded Multiconverter Systems in Hybrid Electric Vehicles," 5 pp., University of Texas at Arlington, TX, date unkown.

Jayabalan, R., Fahimi, B., "Next Generation Naval Shipboard Power System: Issues and Challenges," 1 p., University of Texas at Arlington, TX, date unkown.

Jayabalan, R., Fahimi, B., "Diagnosis of Solid State DC/DC Cascaded Converter Faults in Hybrid Electric Automotive Poser Systems," Copyright 2005 SAE International, 7 pp.

Jayabalan, R., Fahimi, B., "Fault Diagnosis and Condition Monitoring of Power Electronic Systems in Automotive Applications," University of Texas at Arlington, TX, 5 pp., no dated.

(Continued)

Primary Examiner—Bryan Bui
(74) Attorney, Agent, or Firm—Gardere Wynne Sewell LLP

(57) ABSTRACT

As described herein is a vehicle, system, method and device for monitoring, detecting and diagnosis of one or more faults in single- or multi-converter power system. Through use of existing devices within the power system, particularly semiconductor devices, output parameters may be monitored for deviations from normal operation. In addition, faults may be detected and/or diagnosed within the failure withstand time of the existing device.

21 Claims, 11 Drawing Sheets

OTHER PUBLICATIONS

Jayabalan, R., Fahimi, B., "Monitoring and Fault Diagnosis of Multiconverter Systems in Hybrid Electric Vehicles," 20 pp., no dated.

Jayabalan, R., Fahimi, B., "Monitoring and Fault Diagnosis of Cascaded Converters in Hybrid Electric Automotive Systems," University of Texas at Arlington, TX, 6 pp., no dated.

Jayabalan, R., Fahimi, B., "Next generation naval shiboard power system: issues and challenges," University of Texas at Arlington, TX, 9 pp. no dated.

Jayabalan, R., Fahimi, B., "Monitoring and Fault Diagnosis of Cascaded Multiconverter Systems in Hybrid Electric Vehicles," Proceedings of IEEE Vehicular Power and Propulsion Conference, Sep. 2005, Chicago, IL, 5 pp.

Jayabalan, R., Fahimi, B., "Next Generation Naval Shipboard Power System: Issues and Challenges," (Abstract) Marine Engineers Review, Feb. 2006, London, UK, 1 p.

Jayabalan, R., Fahimi, B., "Diagnosis of Solid State DC/DC Cascaded Converter Faults in Hybrid Electric Automotive Power Systems," #2006-01-0370 Proceedings of Society of Automotive Engineers World Congress, Apr. 2006, Detroit, MI, 7 pp.

Jayabalan, R., Fahimi, B., "Fault Diagnosis and Condition Monitoring of Power Electronic Systems in Automotive Applications," Power Conversion Intelligent Motion International Exhibition and Conference, May-Jun. 2006, Numberg, Germany, 5 pp.

Jayabalan, R., Fahimi, B., "Monitoring and Fault Diagnosis of Multiconverter Systems in Hybrid Electric Vehicles," Proceedings IEEE Vehicular Power and Propulsion Conference, Sep. 2005, Chicago, IL, 20 pp.

Jayabalan, R., Fahimi, B., "Monitoring and Fault Diagnosis of Cascaded Converters in Hybrid Electric Automotive Systems," Proceedings of Power Electronics Specialist Conference, Jun. 2006, Jeju, Korea, 6 pp.

Jayabalan, R., Fahimi, B., "Next generation naval shipboard power system: issues and challenges," Proceedings 8th International Naval Engineerings Conference, World Maritime Conference, Mar. 2006, London, UK, 9 pp.

Jayabalan, R., Fahimi, B., "Monitoring and Fault Diagnosis of DC-DC Multistage Converter for Hybrid Electric Vehicles," Proceedings IEEE International Symposium on Diagnostics for Electric Machines, Power Electronics and Drives, Sep. 2005, Vienna, Austria, 6 pp.

* cited by examiner

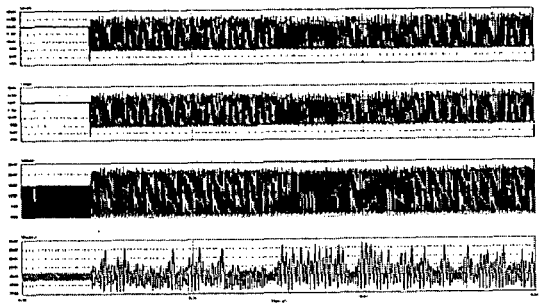
FIG. 5A
FIG. 5B
FIG. 5C
FIG. 5D
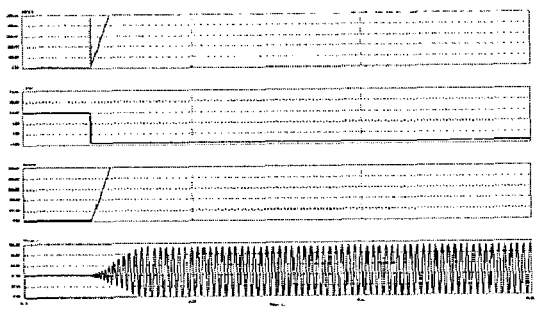
FIG. 6A
FIG. 6B
FIG. 6C
FIG. 6D
FIG. 7
$$V^3 = \frac{1}{N-1}\sum_{t=1}^{N}\begin{bmatrix} (x_{1t}-\overline{x_1})^3 & (x_{1t}-\overline{x_1})^1(x_{2t}-\overline{x_2})^2 & (x_{1t}-\overline{x_1})^1(x_{3t}-\overline{x_3})^2 & - \\ - & - & - & - \\ (x_{3t}-\overline{x_3})^1(x_{1t}-\overline{x_1})^2 & - & - & (x_{3t}-\overline{x_3})^1(x_{4t}-\overline{x_4})^2 \\ - & - & (x_{4t}-\overline{x_4})^1(x_{3t}-\overline{x_3})^2 & - \end{bmatrix}$$
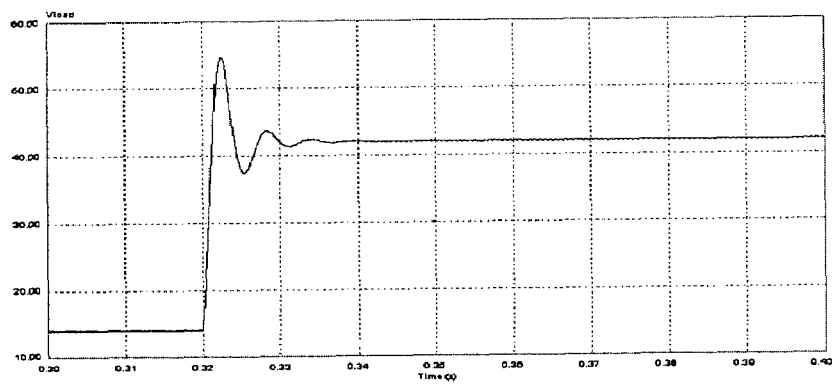
FIG. 8

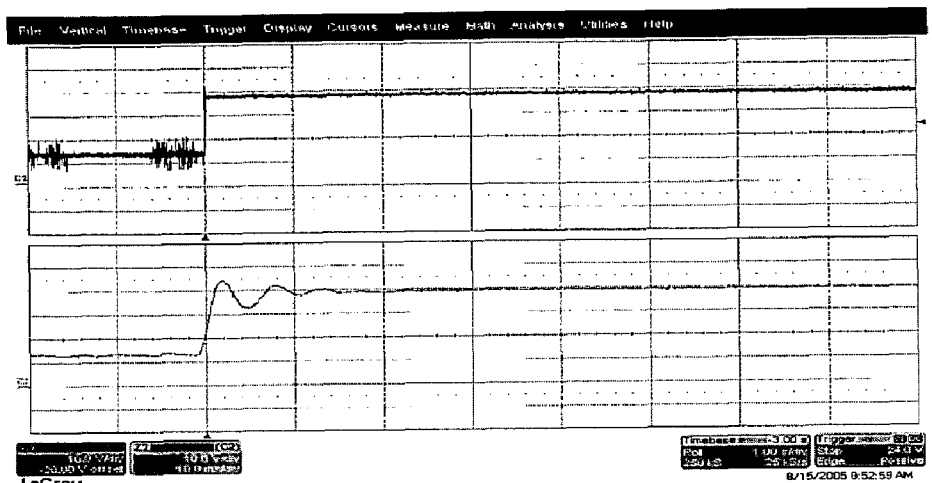
FIG. 9A
FIG. 9B
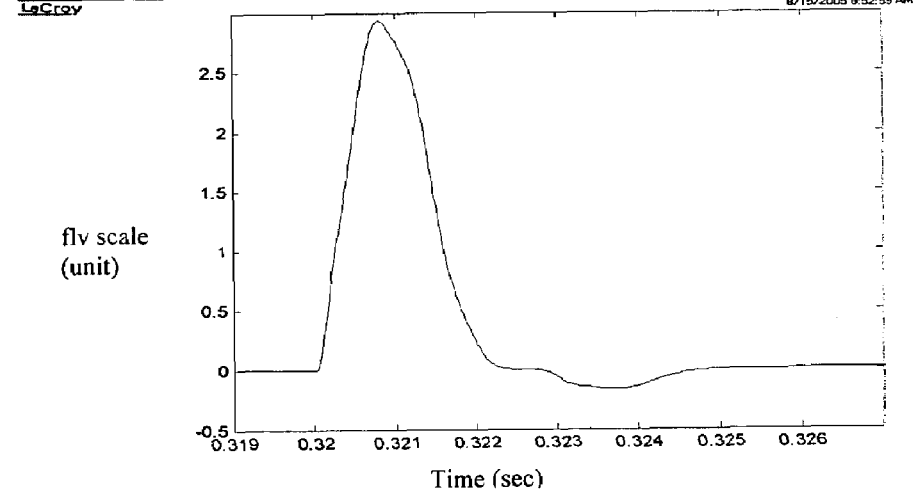
FIG. 10
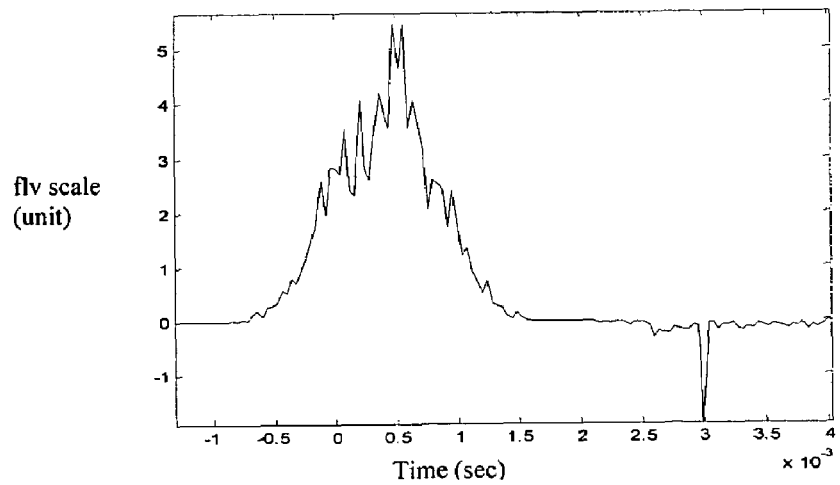
FIG. 11

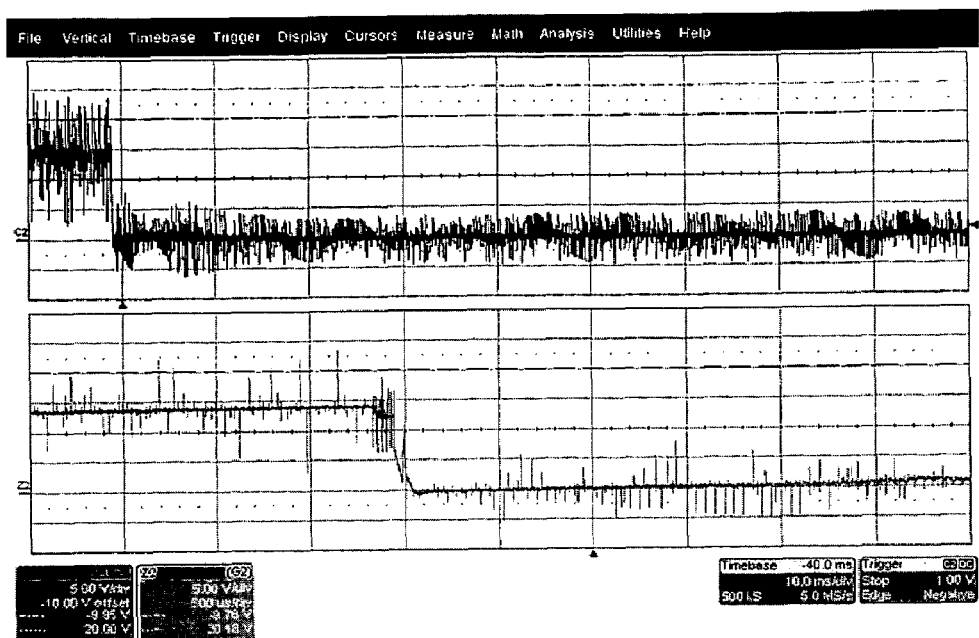
FIG. 12A
FIG. 12B
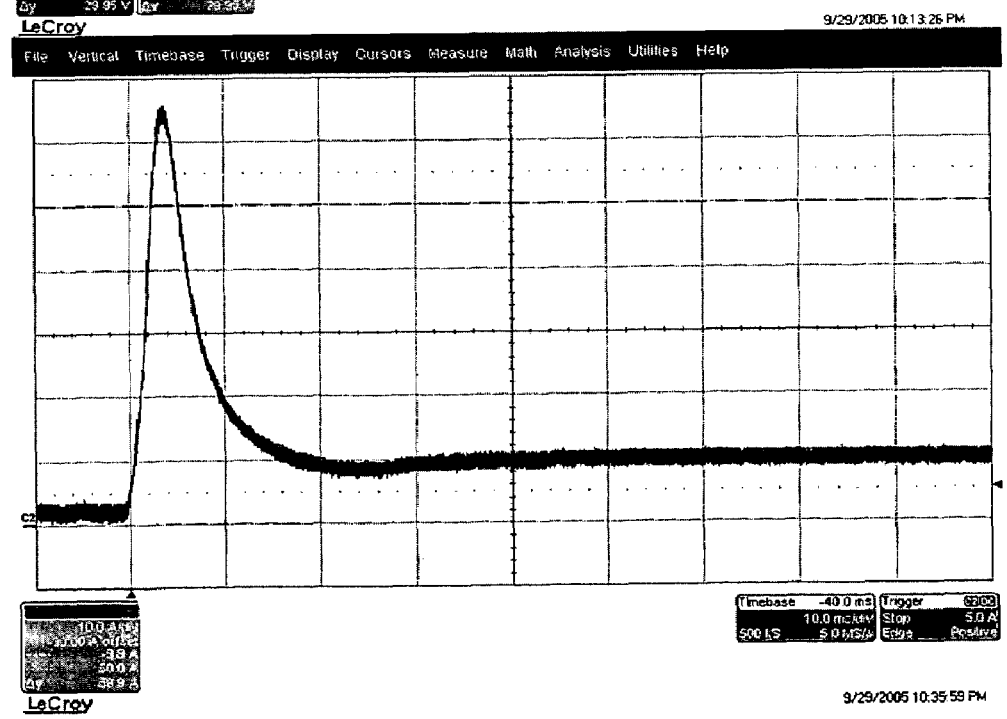
FIG. 13

MONITORING AND FAULT DIAGNOSIS OF SINGLE- AND MULTI-CONVERTER POWER SYSTEMS

CROSS-REFERENCES TO RELATED APPLICATIONS

This application claims the benefit of Provisional Application No. 60/782,077 filed Mar. 14, 2006.

STATEMENT REGARDING FEDERALLY SPONSORED RESEARCH OR DEVELOPMENT

Not applicable.

BACKGROUND OF THE INVENTION

The invention relates generally to the field of power systems, including single- and multi-converter power systems and in particular to monitoring, detecting and/or diagnosing one or more faults in such power converter systems.

Present methods and systems for monitoring, detecting and/or diagnosing fault make use of systems and methods requiring very large knowledge base and/or involving weights to match fault types. Such methods include neural networks, fuzzy logic, genetic algorithm, expert systems, optimization and wavelet, as examples, and are computationally intensive. Most require large memory allocation and often do not provide fast real time fault diagnosis without allowing some damage to first occur to the system. Thus, while more suitable for post fault analysis, existing methods are unable to indicate the type or the nature of the fault. Accordingly, there remains a need to provide improved vehicles, devices, systems and methods for monitoring, detecting and/or diagnosing fault.

SUMMARY OF THE INVENTION

Provided herewith is a description of detection and diagnosis of faults in one or more single or multi-converter power systems. Through use of existing devices, particularly semiconductor devices for system port parameters (e.g., current and voltage measurement that control power conversion systems), parameters may be monitored for deviations from normal operation. In addition, faults may be detected and/or diagnosed within the failure withstand time of the existing device.

Systems, methods, vehicles, and devices described herein are provided to avoid damage to a converter in a power system and to prevent cascading of faults in a single or multi-converter system. For example, to monitor and diagnose faults, a most recent sample is compared with a defined moving sample window of a measured or control output parameter.

Generally, as described herein, such systems, methods, vehicles, and devices may be useful as means for fault monitoring, detection and/or diagnosis in power conversion systems and existing or future fault management systems, e.g., such as systems for generating, distributing, and utilizing electrical energy. Applications include single converter systems, small multiconverter power systems, e.g., automotive power systems, electric and hybrid electric systems, telecommunications, and terrestrial computer systems and large multiconverter power systems, such as Uninterruptible Power Supplies (UPS) and those used in aerospace, the International Space Station (ISS), aircrafts, submarines, commercial and/or naval shipboard and More Electric Ships (MES). Vehicles as described herein comprise single or multi-converter power systems and a means for detecting one or more faults in such power systems.

Those skilled in the art will further appreciate the above-noted features and advantages of the invention together with other important aspects thereof upon reading the detailed description that follows in conjunction with the drawings.

BRIEF DESCRIPTION OF SEVERAL VIEWS OF THE DRAWINGS

For more complete understanding of the features and advantages of the present invention, reference is now made to a description of the invention along with accompanying figures, wherein:

FIG. 5 depicts a representative diode open circuit fault in a load converter;

FIG. 6 depicts a representative example of a 14V DC bus short circuit fault;

FIG. 7 depicts a representative example of a cross-variance matrix of third order statistical moments of particular system parameters;

FIG. 8 depicts a representative example of simulated IGBT2 short circuit in load converter when operating under steady state;

FIG. 9 depicts representative examples of a measured IGBT2 short circuit in a load converter when operating under steady state viewing (A) a 14V bus voltage waveform and (B) a zoomed projection of the fault point;

FIG. 10 depicts a representative example of a third moment of a simulated load O/P voltage (flv signal) detecting a switch (IGBT2) short circuit fault in a load converter in about 400 microseconds;

FIG. 11 depicts a representative example of a third moment of measured load O/P voltage (flv signal) detecting a switch (IGBT2) short circuit fault in a load converter in about 400 microseconds;

FIG. 12 depict representative examples of a measured 14V DC bus short circuit fault when operating under steady state viewing (A) a 14V bus voltage waveform and (B) a zoomed projection of a fault point;

FIG. 13 depicts a representative example of a measured 14V DC bus short circuit fault under steady state operation viewing a 14V bus current waveform;

DETAILED DESCRIPTION OF THE INVENTION

Figure 1A:
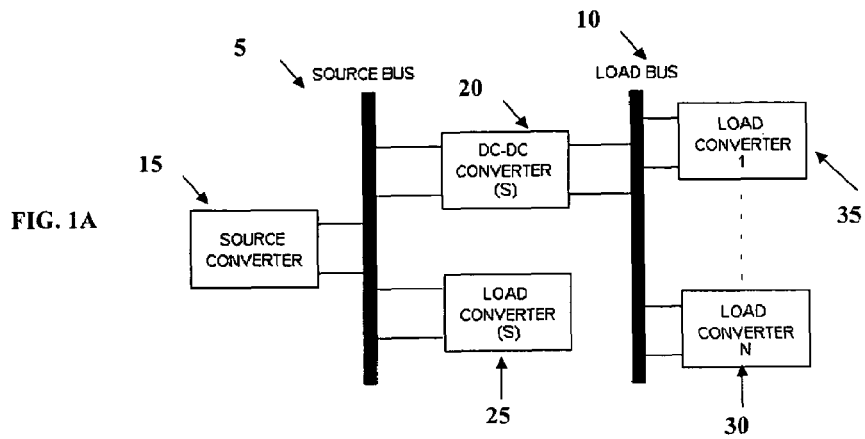
FIGS. 1A-1D depict simplified representative schematics of power systems in accordance with various embodiments described herein.

Although making and using various embodiments are discussed in detail below, it should be appreciated that the present invention provides many inventive concepts that may be embodied in a wide variety of contexts. The specific aspects and embodiments discussed herein are merely illustrative of ways to make and use the invention, and do not limit the scope of the invention.

In the description which follows like parts may be marked throughout the specification and drawing with the same reference numerals, respectively. The drawing figures are not necessarily to scale and certain features may be shown exaggerated in scale or in somewhat generalized or schematic form in the interest of clarity and conciseness.

Faults may occur in any application relying on a solid state converter. Such faults, especially when undetected may lead to one or more fatal consequences as compared to more mechanical counterparts. By using statistical moments, the monitoring, detection and/or identification of faults in a solid state converter, single- and/or multi-converter system is further described herein. As an improvement, a converter system's existing devices (e.g., current and voltage sensors) are used without the need for additional devices. Accordingly, as described herein, the capability of detecting a converter system malfunction as well as for providing information on the device under one or more faults and the nature of the fault(s) are all available. Such accurate detection, particularly with the accuracy provided herein, allows appropriate action to be taken to avoid propagation of the one or more faults as well as the prevention of a catastrophic failure.

As electric loads in converter systems have increased, new electronics-based power systems and architectures have been considered. However, with increasing electrical and electrically-driven loads on such power systems, there are increasing concerns on the reliability of such power systems. Faults occurring in such application specific solid state converters can lead to fatal consequences as compared to their mechanical counter parts. Thus, it is vital to identify faults, the failed device(s) and mode of failure in such systems so as to develop necessary safety techniques and methodologies.

Representative systems for analysis and detection of various types of faults are depicted schematically in FIG. 1. A multistage DC-DC converter system, comprising different types of converters is depicted in FIG. 1A. The system comprises a source bus 5, load bus 10, a source converter 15, a DC-DC converter 20 and one or more load converters 25, 30, and 35. A two cascaded DC-DC buck converters 40 and 50, are provided as FIG. 1B. Examples of large scale multiconverter systems are provided in FIGS. 1C and 1D, wherein 1C is a representative schematic for More Electric Aircrafts and 1D is for Space Power Systems.

While FIGS. 1A-1D are representative examples, any DC/DC power conversion system is suitable, including Buck (Step-down converter), Boost (Step-up) converter, and Buck-Boost (Step-down Step-up) converter. Accordingly any number of converter circuit configurations and designs may be used, in addition to those provided herein, including systems comprising more or less complexity, an output side of AC/DC rectifier, an input side of DC/AC inverters, and any large multiconverter systems where each subsystem can perform a local diagnosis along with its control and communicate fault signals/signatures to overall fault management systems to diagnose fault system-wide, as further examples. Typical single converters will include one or more sensors at the output alone or at the input and output. The latter maximizes the availability of information available for monitoring, detecting and/or diagnosing and thereby enables the detection and diagnosis of more faults (typically the more parameters analyzed the more faults are diagnosed).

Figure 1B:
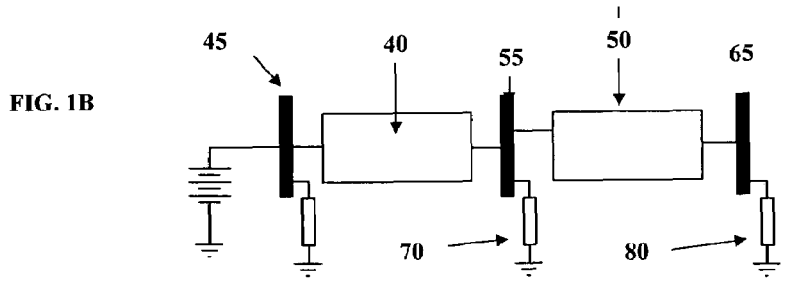
Figure 1C:
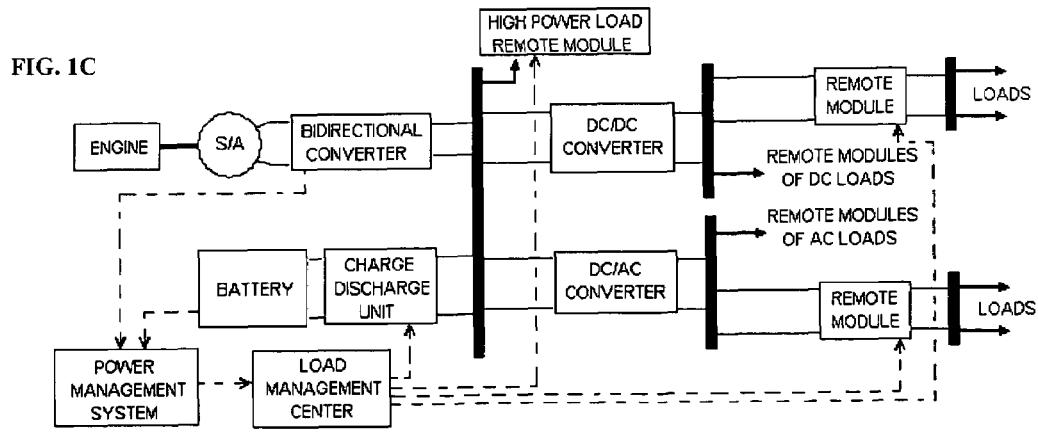
Figure 1D:
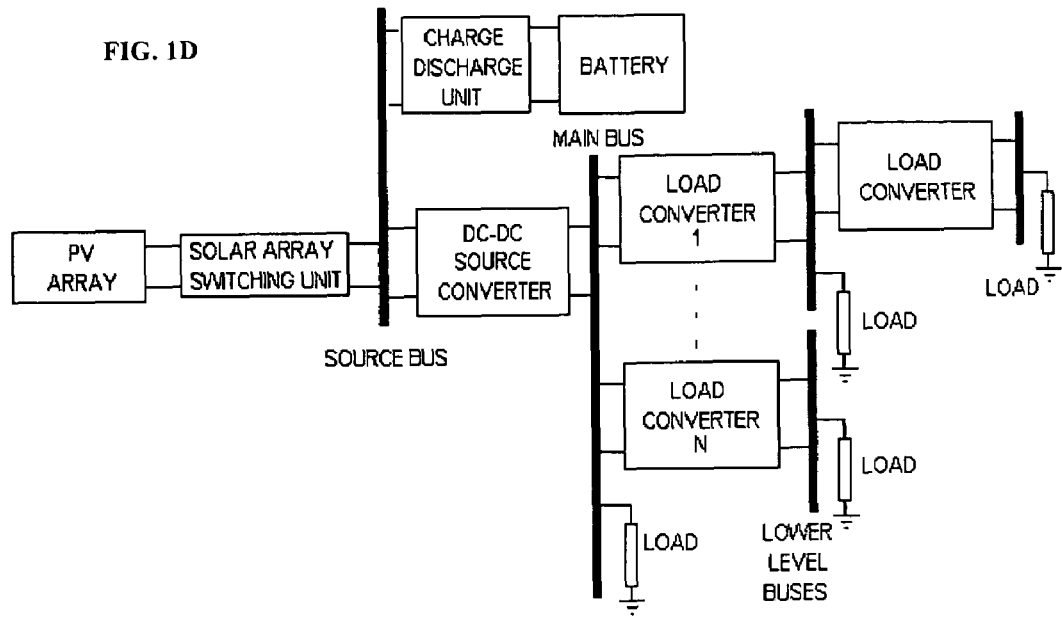

As further shown in FIG. 1B, a first DC-DC converter 40 acts as a source converter that steps down a first voltage (V) input 45 to a second, lower V input 55. A second DC-DC buck converter 50 behaves as a load converter stepping down a second V input 55 to third and even lower V input 65. Additional loads 70 and 80 may also be connected to the source and/or load converters. Such loads, depending on the power system requirements, may be resistive or highly inductive loads.

A close representation of FIG. 1B may be a hybrid electric power system, comprising two cascaded converters similar to those depicted as 40 and 50. Converter 40 would typically be a source converter, converting a DC voltage, for example of 300 V (as first bus 45) to about 42 V (as second bus 55). Converter 50 would typically be a load converter, converting the 42 DC voltage (second bus 55) to, for example, 14 V (as third bus 65). When a short circuit fault is initiated on the load converter controllable switch causing voltage and current parameters to change, a higher order statistical moment, in this case a third order moment of the load converter output voltage is applied to indicate the presence of a load converter switch fault and/or the short circuit. Diagnosis of such a fault is both rapid and accurate. Existing current and voltage sensors (port parameters) of the systems shown in FIG. 1 are typically provided as described further.

Nth order statistical moments are effective as they dynamically evaluate and monitor system deviations (e.g., voltages, currents) from normal operations. The direction of the deviations provides for a detection and a diagnosis of a fault fast enough to prevent escalation. Accordingly, monitoring and identification of a single failure (e.g., device failure) in the system prevents escalation of the fault that would otherwise occur if a controller continued to operate without knowledge of the first fault. By providing failure mode information derived from the system, isolation of a fault and reconfiguration of safety critical systems may be performed to ensure sustainable operation and safety.

Fault on a system as provided herein may be include a physical defect or a material damage of one or more elements or of a portion of the system causing a failure. Such faults will include transient, intermitted and/or permanent faults as provided in an open circuit and/or short circuit in one or more semiconductor devices of the system. Providing open circuit and short circuit information as performed herein is essential for system reconfiguration. In addition, faults on other system elements (other than semiconductor elements) are provided with the system, method and device as further described herein.

Identification of one or more faults is crucial to effectively manage them and keep their impact minimal. Fault management is typically achieved in four stages: (1) fault detection, including discovering the existence of a fault in the system; (2) fault identification, including identifying the nature and location of the fault; (3) fault localization, including constraining the fault to a sufficiently small element, subsystem or functional portion of the system; and (4) fault correction, including taking the appropriate corrective action to restore normal system operation.

Traditionally, after detecting a fault, fault identification follows fault localization, such that after a fault is detected in a system, a section of the system is immediately localized, and other loads are generally disconnected from the localized region. This is typically followed by identification of the fault by diagnosis; healthy (non-fault) loads are moved back into the system once identified. In some systems, however, localizing a fault immediately after its detection without performing any diagnosis of the fault may lead to a more catastrophic consequences, particularly as more safety or performance loads (e.g., those driven electrically) are added into the system. An analogy is an automotive system. This and other advanced systems under fault may still be able to continue sustained operation with reduced performance and may be a preferred option rather than disconnecting a portion of the system and impede safety. As such, it may be more beneficial to detect a fault and then rapidly identify it before localizing it. As provided herein, fault detection and identification may be combined as a collective subproblem, also referred to as fault diagnosis.

Different search strategies or combinations of strategies may be used to detect a fault. One strategy, topological search, involves the use of normal system models to judge whether a field is good or bad and then examines the next field where fields in the same level are logically or physically adjacent. This strategy is not economical, particularly because its observations may not lead to a diagnosis. An alternative strategy is a symptomatic search that searches a library of symptom patterns to match observed symptoms and associate system states with an identified symptom pattern. In the event of ambiguity, more observations are collected to resolve it. Unfortunately, this strategy is complicated and requires dynamic and failure simulations, increased memory capacity as well as memory management. By combining both search strategies, observed symptoms may be associated with one or more causes and from such hypothesized causes, possible symptoms may be related.

There have been many fault diagnosis techniques using expert systems, neural networks (NN), fuzzy logic and wavelets. Using expert systems in fault diagnosis involves the use of a knowledge base consisting of a data base and rules. The database involves facts and information about the system values, parameter characteristics and component interconnections details developed from reasoning methodologies of human experts, knowledge of normal working condition obtained from steady state measurements and simulations, past experiences in fault diagnosis and statistical treatment of measurements. The rules in the knowledge base are used by inference engines to diagnose the system condition from behavioral, functional and topological as well as even from circuit breaker status. However, depending on system complexity, expert system may become cumbersome and inflexible with little or no time to attend the fault without incurring catastrophic failure of the system under concern or cascading faults.

Diagnosis as described herein further relies on several computations, including fuzzy logic, which is a non-linear input/output mapping as is known to one of ordinary skill in the art. Fuzzy logic is able to handle imprecision of I/O variables and is ideal for handling system uncertainty, especially where inputs lack clear crisp boundaries. It also provides robustness to model uncertainty by ability and to update empirical fits or maps with data previously not considered. Other computations as are known to one of ordinary skill may also be used based on what would be an acceptable level or degree of accuracy, precision, computation time, diagnosis time, extent of information desired and ability to differentiate faults.

Figure 2:
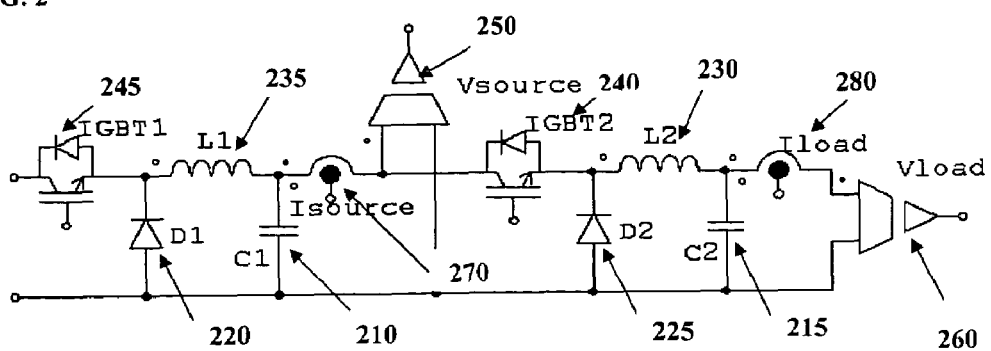
FIG. 2 depicts a representative schematic of a circuit layout of a cascaded converter with one or more devices.

Referring now to FIG. 2, a circuit diagram of a cascaded converter is shown, where 210 and 215 are output capacitor, 220 and 225 are diodes, 230 is an inductor for a load converter, 235 is an inductor for a source converter, 245 is a source converter switch (IGBT1) and 240 is a load converter switch (IGBT2). Devices as sensors for voltage and current (I) are positioned at the output of each individual converter for control, shown as 250 ($V_{source}$), 260 ($V_{load}$), 270 ($I_{source}$) and 280 ($I_{load}$); such devices are also used herein for monitoring and detecting a fault. The topology of FIG. 2 has four legitimate modes of operation (under no fault) shown in FIGS. 3A-D. FIGS. 3E-3F represent an intermediate topological state specific to diode open circuit faults and switch open circuit fault scenarios. FIGS. 3G and 3H represent intermediate state in a diode short circuit fault that are illegitimate modes of operation. Such analysis is limited to continuous conduction mode.

Figure 3A:
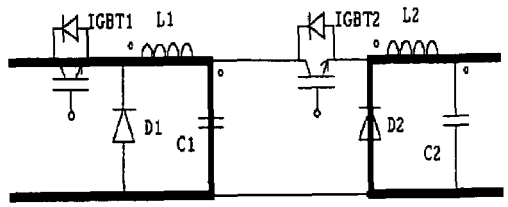
FIG. 3A-3H depict representative schematics of operational states of a cascaded multiconverter system.
Figure 3B:
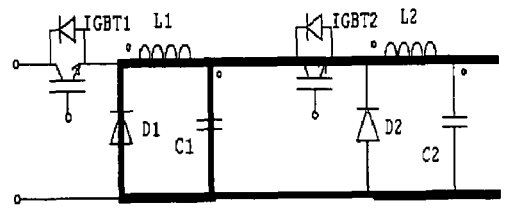
Figure 3C:
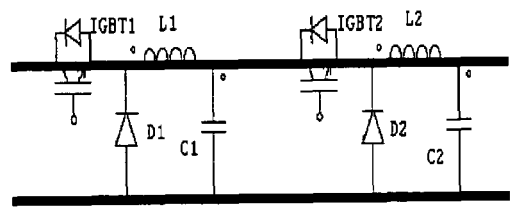
Figure 3D:
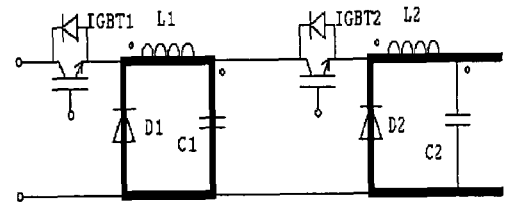
Figure 3E:
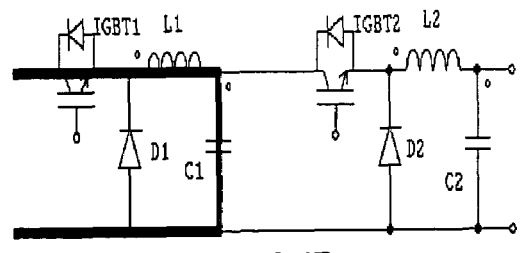
Figure 3F:
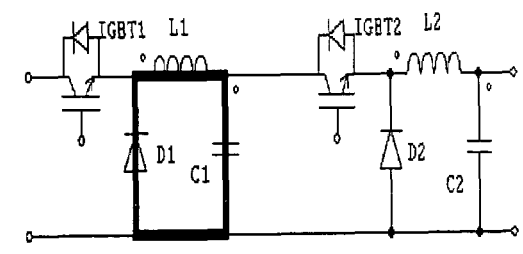
Figure 3G:
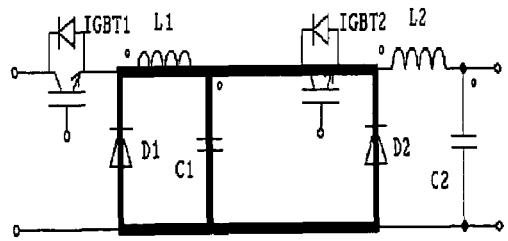
Figure 3H:
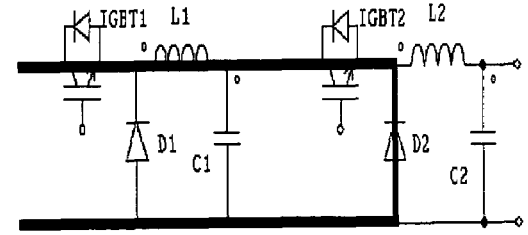

In FIG. 3A, operation of two cascaded converters with a load converter switch off (IGBT2) and with a diode (D2) completing the output circuit is shown. FIG. 3C illustrates a topological state with both a source converter switch (IGBT1) and a load converter switches (IGBT2) are in the on state. FIGS. 3E and 3F, although legitimate operating modes with only source converter (IGBT1) in operation are not valid intermediate states under a cascaded mode of operation.

Figure 4A:
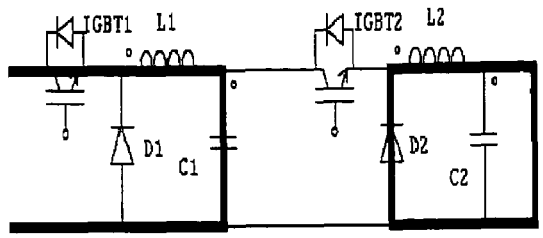
FIG. 4A-4F depict representative topological states on 14V and 42V bus short circuit faults.
Figure 4D:
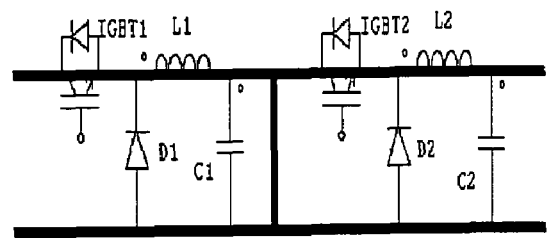
Figure 4B:
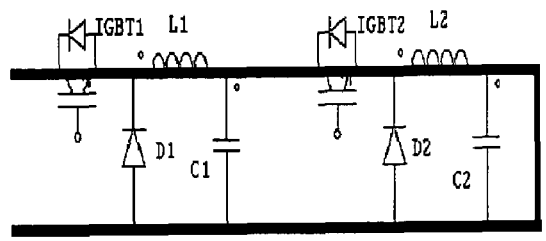
Figure 4E:
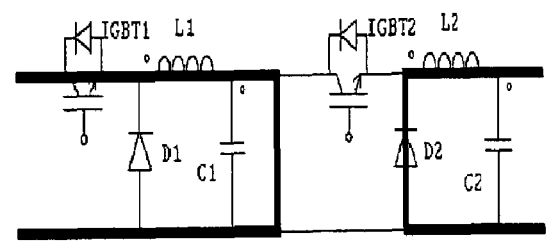
Figure 4C:
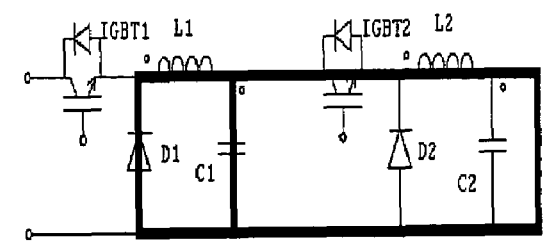
Figure 4F:
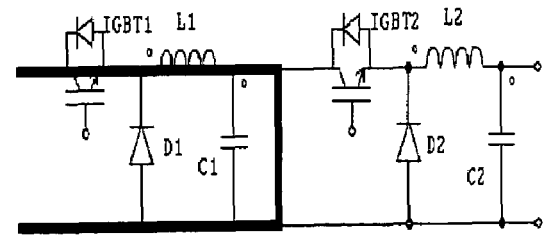

FIGS. 4A-4C each represent a short circuit fault on a third Bus, which when referring to an example of FIG. 1B, is, for example, a 14V Bus. The bus fault may occur at any instant as shown in FIGS. 4A-4C. Nonetheless, a fault that may occur when either IGBT1 is off (e.g., FIG. 4C) or IGBT2 is off (e.g., FIG. 4A) would lead to switching between states, as shown in FIGS. 4B and 4C. A short circuit fault on a second Bus, which when referring to an example of FIG. 1B is, for example, a 42V Bus, is depicted in FIGS. 4D-4F. A fault under a state shown in FIG. 4D would cycle through a state as shown in FIG. 4E discharging the load converter inductor (L2) and shown in FIG. 4F, leaving the load converter disconnected.

Referring now to FIG. 5, the image depicts a location where an open circuit fault occurs in a system similar to that depicted in FIG. 2. Here, a fault is in a second diode (shown as diode 225 in FIG. 2). Following the fault is a sudden dip in the $I_{load}$ and $V_{load}$ and a state similar to that shown in FIG. 3E or FIG. 3F. Plot variables include a $V_{source}$ as a source converter output voltage (V) (FIG. 5D), $I_{source}$ as a source converter output current (A) (FIG. 5C), $V_{load}$ as a load converter output voltage (V) (FIG. 5B), and $I_{load}$ as a load converter output current (A) (FIG. 5A). Accordingly, upon fault, $V_{load}$ will momentarily drop to a lower voltage (depicted here to about 5 V followed by a sustained 71% ripple in the load converter output voltage ($V_{load}$)). Because a pure resistive load of 1 Ohm was considered as the load converter output, the voltage and the current have almost identical waveforms. In addition, the average input current at the input of the load converter or the output current of the source converter ($V_{source}$) will increase (from about 5 Amp to about 10 Amp as depicted in FIG. 5C) as will a current ripple, primarily due to freewheeling of the load converter current through a first diode (D1) (depicted as diode 220 in FIG. 2) in the source converter as shown in FIG. 3B. The voltage waveform of the source converter ($V_{source}$) may also show some instability as depicted in FIG. 5D. Thus a load converter depicted here will switch in and out of a healthy topological state (as shown in FIGS. 3B and 3C) by cycling through a state shown in FIGS. 3B-3F.

Referring to the circuit diagrams as provided in FIG. 1B and FIG. 2, a short circuit in a third DC bus (e.g., a 14 V bus as depicted in component 65 of FIG. 1B), will pull down the 14V bus voltage ($V_{load}$) while the second DC bus (e.g., a 42V bus as component 55 of FIG. 1B) will undergo a short circuit via the third DC bus when a load converter switch is turned on each time, as depicted in FIG. 4B and FIG. 6B. As depicted in FIG. 6D, $V_{source}$, will be unstable and will fluctuate in voltage (shown here to fluctuate between about zero and 95V at a frequency of 540 Hz with an average output voltage of 46V, a 9.5% increase in nominal voltage). A large spike observed in the output current ($I_{load}$) of the load converter as depicted in FIG. 6A was because the load converter inductor was fully charged towards the end of its charging cycle when the third DC Bus short circuit fault occurred. A spike is found to occur within about 20 microsecond of bus fault and has a large magnitude (depicted to about 450 A with this circuit) and may damage any connected load. Such a spike is not observed when a bus short circuit fault takes place as the inductor is in a discharge cycle. Nonetheless, the load and the source converter output currents will increase to extremely large values that will damage both converters, as illustrated in FIGS. 6C and 6A.

From such observations as described above, it is anticipated that a cascaded fault will occur with a load converter switch short circuit (e.g., in load converter switch 240 depicted as IGBT2 in FIG. 2) following a third DC bus short circuit. Because such a load converter is a current intensive system as compared with a source converter, switch and diode current ratings of the load converter would be higher. Upon Bus fault, IGBT2 of FIG. 2 remains on continuously; however, a source converter switch 245 ((IGBT1, as depicted in FIG. 2) and diode 220 (D1) will continue operating with a duty cycle in an attempt to maintain the required 2nd DC bus output. When IGBT1 turns off, diode D1 conduct and freewheels the fault current in a load converter as depicted schematically in FIG. 4C. In this scenario, when D1 has lower current rating, it would get short circuited which will short the 1st DC bus (e.g., a 300 V bus as depicted by component 45 of FIG. 1B) when IGBT1 turns on a first time after a diode D1 short circuit leading to the load converter disconnecting from the cascaded system without any damage.

The circuit diagram of a cascaded converter such as that depicted FIG. 2 will have circuit parameters as provided in TABLE 1. The subscript 1 and 2 are used to identify the source and load converter components respectively as provided in FIG. 2 and "S. No" refers to serial number. In this scenario, each converter was rated for 200 W with an output voltage regulated by a pulse width modulated (PWM) signal using conventional PI control. The switching frequency of each converter was 20 kHz. Voltage ($V_{source}$ and $V_{load}$) and current sensors ($I_{source}$ and $I_{load}$) were placed at the output of each individual converter providing feedback for their control. These sensors are used for monitoring and detecting a fault. A digital signal processor (DSP) was used for signal acquisition (at 50 kHz) and control, having a high computational speed of 150 MIPS (million instructions per second) and used to perform on chip monitoring, detection and diagnosis computation.

TABLE 1

Circuit parameters

| S. No. | Description | Source Converter Parameter | Load Converter Parameter | Units |
|---|---|---|---|---|
| 1 | Input/Output Rated Voltage | 300/42 | 42/14 | VDC |
| 2 | Rated/Peak Output Current | 5.25/9.5 | 14/20 | A |
| 3 | Switching Frequency | 20 | 20 | kHz |
| 4 | Inductance | 1.0 (L1) | 0.5 (L2) | mH |
| 5 | Output Capacitor | 600.0 (C1) | 100.0 (C2) | uF |
| 6 | Gain | 0.1944 | 0.07502 | const |
| 7 | Time Constant | 0.002 | 0.00022 | sec |

The measured output voltage and current at the source and load converters are continuously monitored to detect any abnormality. Statistical moments of a sampled window of continuously measured voltage and current are then used to detect a fault within a system (e.g., failure withstand time of one or more power devices or cascading fault events). Differentiation of a fault is achieved by an nth order moment of measured signal that provided information on the direction of the variation of the measured signal, wherein n is greater than or equal to 3 and an odd number.

In general, the expression for an nth order moment ($s^n$) as described is provided in equation (1), wherein the mean of the moving sampled window measures (M) is compared with the current measure (y) with a defined sample window size of N.

$$s^n = \frac{\sum_{k=1}^{N}(y_k - M)^n}{N-1} \quad (1)$$

Such a computation is not intensive and may be performed on a chip without any overhead and requiring only very low memory. The order may be any nth order of three or greater, wherein n is an odd number. A third order is sufficient; higher order values may require more computation. The third statistical moments of the measured signals are represented by flv, flc, fsv and fsc for load voltage, load current, source voltage and source current respectively. Higher orders may be preferred for certain power systems, topological states, and/or fault types as is known to one of ordinary skill in the art; however a third-order calculation of measured terminal values is typically sufficient in sensitivity and for detection of system anomalies, including one or more faults.

TABLE 2 is a representative map for possible conditions of a device firing signals and third moment of measured signals. As provided in TABLE 2, oc is open circuit and sc is short circuit. With a representative map, when a cascaded load converter, such as that depicted in FIG. 2, is unfaulted, the system maps to "No Fault." Deviation to any other block other than "No Fault," will cause a fault detect flag to be set and to identify the fault type.

TABLE 2

Representative map for firing signals and
third moment of measured signals.

| Gate Signal | | | | | | | |
|---|---|---|---|---|---|---|---|
| $T_{IGBT1}$ | $T_{IGBT2}$ | flv | flc | fsv | fsc | Fault | Examples |
| x | x | ~0 | ~0 | ~0 | ~0 | No Fault | FIGS. 3A, 3B, 3C, 3D |
| x | 1 | <0 | >0 | — | — | 3rd Bus sc | FIGS. 4A, 4B, 4C |
| x | 0 | >0 | — | — | — | IGBT2 sc | FIGS. 3B, 3C |
| x | 1 | <0 | — | >=0 | — | IGBT2 oc | FIGS. 3 A, 3D |
| x | 1 | <0 | — | <0 | — | D2 sc/2nd Bus sc | FIGS. 3G, 3H, 4D, 4E, 4F |
| x | 0 | — | — | <0 | >0 | 2nd Bus sc | FIGS. 4D, 4E, 4F |
| x | x | >0/<0 | | dc >0 | | D2 oc | FIGS. 3E, 3F | x: Don't care
DC: second moment of load converter duty cycle
1 - Device On
0 - Device Off The above faults are generally represented as a cross-variance matrix of nth order statistical moments of system parameters, in which n is 3 or greater and an odd number. On example is depicted in FIG. 7 in which a $3^{rd}$ order is sufficient and was used for such computations. To simplify the representation, a common sample window size (N) is taken for all the system parameters (voltage and currents). It is observed that certain elements in the matrix distinctively project a presence of a fault along with indicating the type of fault. Other elements in the matrix that do not project a distinct relation to a fault are ignored and are not shown in the matrix. In the matrix, $X_1$ is flv (load converter output voltage—Vload); $X_3$ is fsv (source converter output voltage—Vsource); $X_2$ is flc (load converter output current—Iload); $X_4$—fsc (source converter output current—Isource); and $X_t = (x_{1t}, x_{2t}, x_{3t}, x_{4t})^T$ is a vector denoting t=1, 2, 3 ... N observation for time series of $X_1, X_2, X_3, X_4$ vector.

Element (1, 1) is a third moment of the load converter output voltage ($V_{load}$) or $X_1$ when positive indicates a presence of an IGBT2 short circuit fault in the load converter. This coincides with an IGBT2 short circuit fault noted in TABLE 2. $(x_{1t}-\overline{x_1})^1(x_{2t}-\overline{x_2})^2$, element (1, 2) is a cross-variance between load converter output voltage ($V_{load}$) or $X_1$ and load converter output current ($I_{load}$) or $X_2$, which project a 3rd bus short circuit fault while, element (1, 3), $(x_{1t}-\overline{x_1})^1(x_{3t}-\overline{x_3})^2$ is a cross-variance between load converter output voltage ($V_{load}$) or $X_1$ and source converter output voltage ($V_{source}$) or $X_3$, and indicates an IGBT2 open circuit fault. Similarly, element (3, 1) indicates load converter diode short circuit fault while (4, 3) indicates 42V bus short circuit. The 3rd order cross-variance matrix in FIG. 7 can be generalized to an $n^{th}$ order. In addition, inclusion of input parameters (voltage and current) of the converters would shed more light into fault diagnosis from the cross-variance matrix.

As an example, consider a case of a switch short circuit fault (IGBT2) of a load converter that results in two possible states shown in FIGS. 3B and 3C (depending on the topology prior to the occurrence of fault). FIGS. 3B and 3C are legitimate operating states under normal switch (IGBT2) operation when it may be turned on/off by a gating signal and may change over to the next state (as depicted in FIG. 3A or FIG. 3D). From TABLE 2, when flv>0 and $T_{IGBT2}$=0 (gating signal off), a fault detect flag is triggered and identifies an IGBT2 device short circuit. To conduct a fault test an 8 Ohm output, load resistance at a 3rd (e.g., 14V) bus was used to safely limit fault current to a lower value (as depicted here to be approx 5.25 A) as against a 14 A under rated and 42 A under fault conditions. As provided with this example, all semiconductor switches were overrated for fault analysis (e.g., to safely conduct the example and to analyze and test a fault multiple times without damaging the components) and is not an occurrence with all situations.

Referring now to FIG. 8, depicted is the switch (IGBT2) short circuit fault in load converter that occurred at a run of 0.32 seconds when the cascaded system (similar to that depicted in FIG. 2) was operating in steady state. FIG. 9A shows the measured output voltage for an (IGBT2) short circuit fault. FIG. 9B is a zoomed view of the fault instant. From FIG. 9B it is observed that upon IGBT2 short circuit fault 42V appeared at the 14V bus in about 2 milliseconds. Corresponding flv signals on fault are represented in FIGS. 10 and 11 for the simulated and measured case, respectively. Typically, and as shown in FIGS. 10 and 11, an IGBT2 fault was detected in at least about 400 microseconds, the time within which the bus voltage increased to only 20V, which was calculated to be only a 43% increase as compared an otherwise 200% increase had a 42V increase occurred in the absence of the detection as provided herein. Clearly without the monitoring and detection provided herein, a 200% increase would have damaged most of 14V load.

A 14V DC bus short circuit fault as analyzed in FIG. 6 may again be considered but with a load of 8 Ohms at the load converter output. Upon a short circuit fault the change in the 14V DC bus voltage and current are shown in FIG. 12 and FIG. 13. No current limit was set on the load converter however; the current at the input side was limited to 10 A to safely conduct the test. This was also done to represent how fast the effect of the short-circuit fault was. A fault current was found to increase to 10 A in approximately 300 microseconds and then overshot to a maximum of 64 A before being limited to 10 A by the system at the input size of the converter. The current exceeded the device (IGBT2) rated current of 50 A, yet was still within the short circuit current failure limit of 100 A. The device short-circuit withstand time was approximately 1.0 msec for IGBT2. Upon bus short-circuit, the 14V bus voltage fell at a faster rate compared to the rate of rise of current due to the presence of a large inductor at the output of the load converter (see FIGS. 12 and 13).

Figure 14:
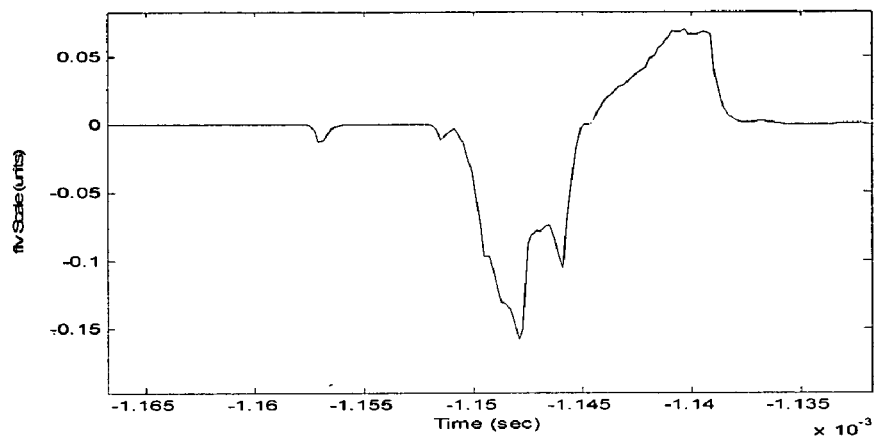
FIG. 14 depicts a representative example of a third moment of a measured load O/P voltage (flv signal) detecting a possible 14V DC bus short circuit fault in about 10 microseconds.
Figure 15:
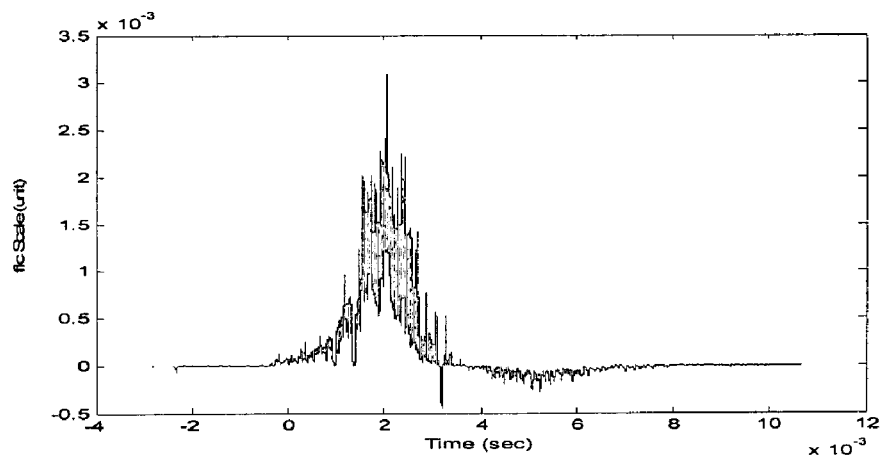
FIG. 15 depicts a representative example of a third moment of a measured load O/P current (flc signal) detecting a 14V DC bus short circuit fault in about 1.5 milliseconds.

Fault signals for a third moment of load converter O/P (output) voltage (flv) and current (flc) are shown in FIGS. 14 and 15, respectively. Both flv and flc fault signals identified the presence of a 14V DC Bus short circuit fault in approximately 1.5 milliseconds. By comparing FIGS. 11 and 14, it is found that a third moment of the load converter O/P (output) voltage (flv) provided insight into how the output voltage was varying. The flc as depicted in FIG. 15 differentiated the 14V Bus short circuit fault from IGBT2 open circuit or D2 short circuit fault (as indicated in TABLE 2).

Figure 16:
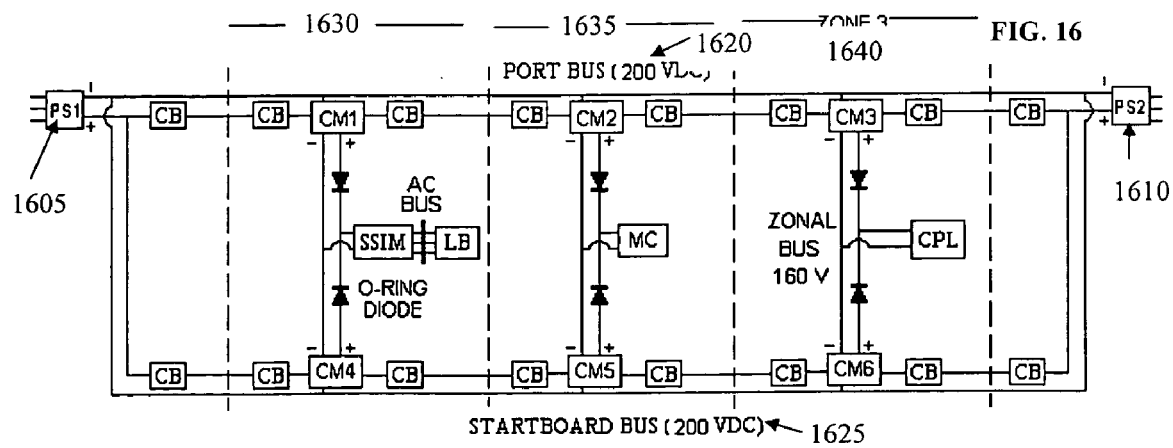
FIG. 16 depicts a representative example of a DC distribution system.

A representative DC zonal electrical distribution system, such as that provided in a vehicle, such as naval vessels, is depicted in FIG. 16. Such a system typically includes two power supplies 1605 and 1610 (PS1, PS2), each typically at 4 kW. In naval systems, one power supply is typically used to feed a port bus 1620, and the other feeds a starboard bus 1625. In such a system, power supplies 1605 and 1610 may behave as uncontrolled rectifiers with LC output filters that deliver 200V DC to the buses. Such a system typically include three zones of DC distribution, 1630, 1635 and 1640. Each zone is fed by a converter module (CM1-3) on bus 1620 and by a second converter module on bus 1625 (CM4-6), operating from one of the two main distribution buses. A main distribution bus is typically referred to as SSCM and consists of a buck converter that steps-down the bus voltage to about 160V DC with a droop characteristic built in that allows load sharing between two SSCM in each zone. In typical naval systems, each SSCM is rated for 1 kW (1.5 kW peak capacity). A load is present in each zone with SSIM that supplies a 3-phase load bank (LB), a motor controller (MC) that drives a 3-phase induction motor and a constant power load (CPL). Each of these loads having a 1 kW capacity is adjustable over the entire power range.

Each zone is connected to both buses through CM and o-ring diodes to prevent fault from one bus being fed by an opposite bus. A fault between SSCM and an o-ring diode may be mitigated by current limits on the SSCM. Under this scenario, an opposite bus may be able to supply the zonal load. In the event of a PS failure or loss of a 200 V DC distribution bus, the other PS and/or opposite distribution bus may be able to take up the entire system load without interruption of service. Circuit breakers (CB) positioned at various locations in each zone facilitate control over power flow in the system by disconnecting a part under fault. On a component level, faults are typically mitigated by one or more control modules.

Figure 17A:
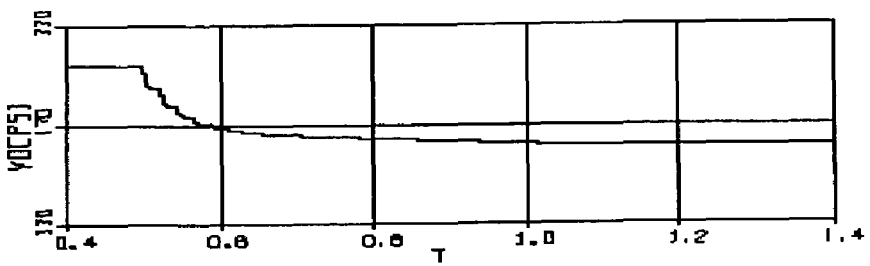
FIG. 17A-D depict representative examples of transients under a loss of a port bus 3-phase power supply, wherein voltage is in volts and t is in seconds.
Figure 17B:
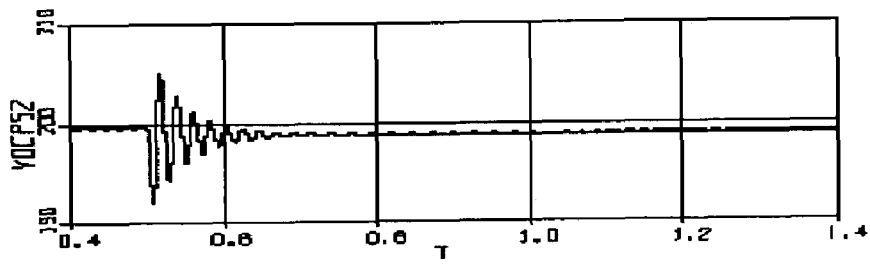
Figure 17C:
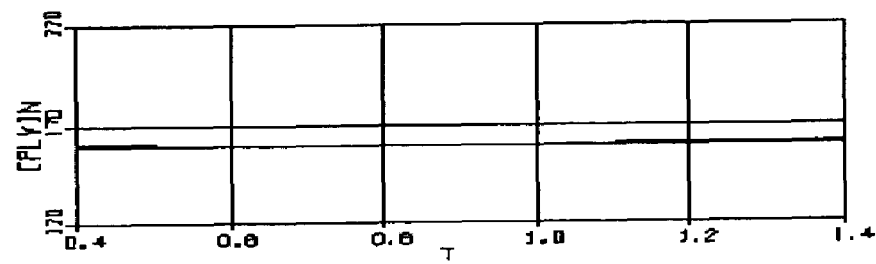
Figure 17D:
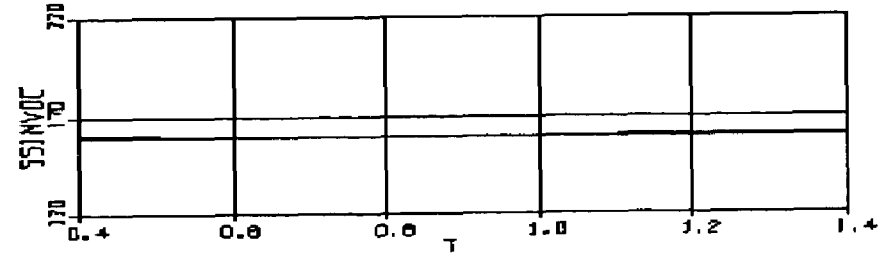

For a system analysis, a non-linear average model of the system as depicted in FIG. 16 is used. A three-phase source is supplied initially to both power supplies. Loads in the three zonal are energized by the two main DC buses 1620 and 1625, each supplied by power supply, 1605 and 1620 respectively. The two SSCMs in each zone supply the load. With loss of power to 1605, DC bus 1620 is de-energized and the full zonal load is transferred to DC bus 1625 as depicted in FIG. 17. For example, loss of 3-phase power occurred at 0.5 seconds. Immediately following this, the port bus voltage (VDCPS1) rapidly fell from 200V DC to SSCM output voltage 160V DC as SSCMs on port side increase their duty cycle to 100% to maintain 160V output (FIG. 17A). Once port side SSCM output falls below 160V, they are cut off due to the o-ring diode as starboard SSCMs maintain the zone voltage and take up the full load supplying power from 1620. Due to the large bus capacitance of DC bus 1620 and SSCM output, the voltage fall is slow below 160V. DC bus 1625 voltage (VDCPS2, FIG. 17B) undergoes oscillation for about 200 milliseconds when full load is transferred to the bus. However, SSCMs act as a buffer so such an oscillation does not cascade to the three zonal loads, and the system is capable of maintaining a steady 160V (CPLVIN, SSIMVDC, for zone 1 [FIG. 17C] and 3 [FIG. 17D], respectively).

Figure 18:
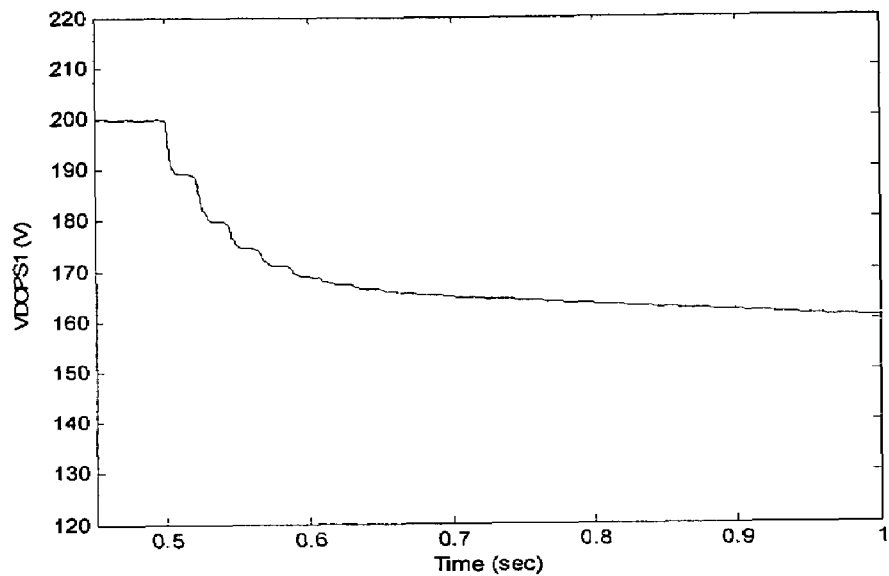
FIG. 18 depicts a representative example of a port bus voltage (VDCPS1)
Figure 19:
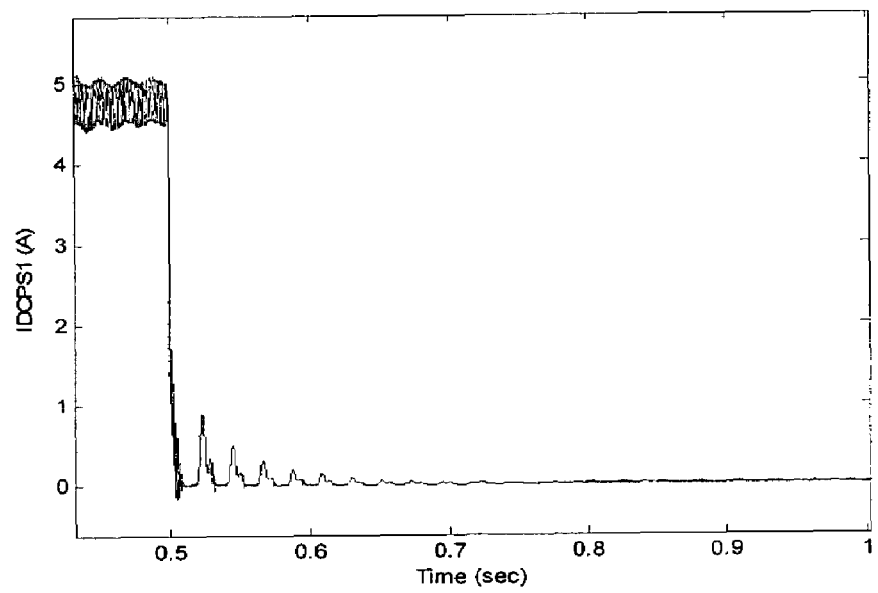
FIG. 19 depicts a representative example of a port bus current (IDCPS1)
Figure 20:
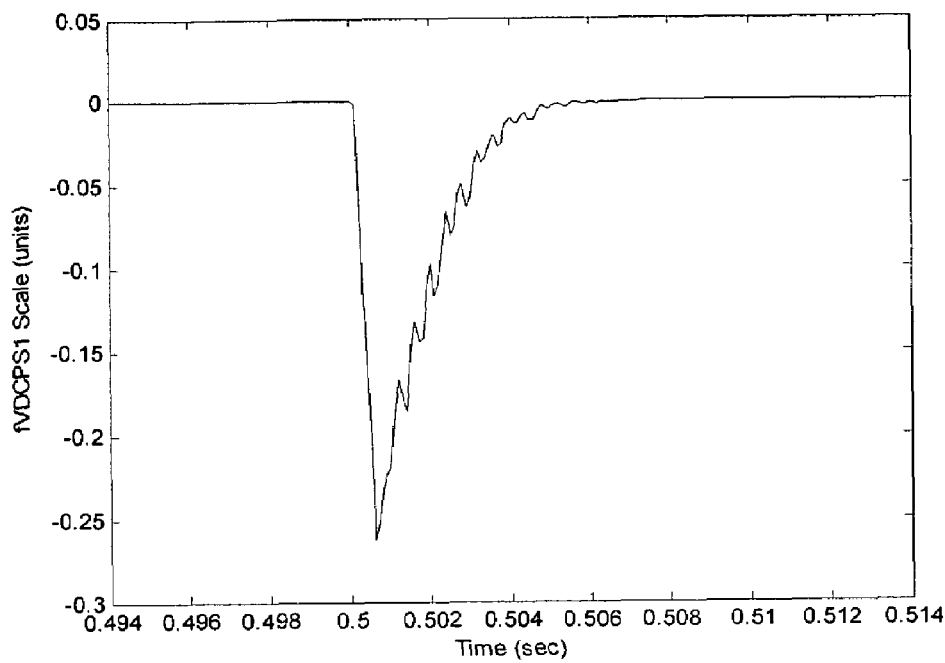
FIG. 20 depicts a representative example of a third moment of VDCPS1.
Figure 21:
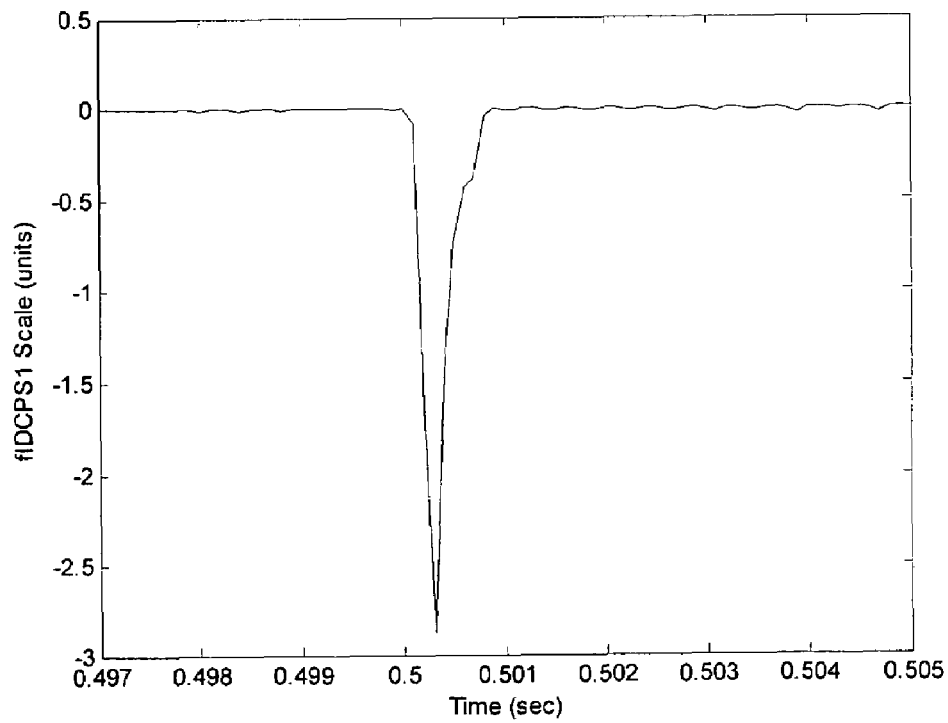
FIG. 21 depicts a representative example of a third moment of IDCPS1.

Should there be a loss of 3-phase input power to power supply 1605. The power supply output voltage (VDCPS1) and current (IDCPS1) are designed to indicate the point of 3-phase power loss as VDCPS1 fall to 160V in 1 second after malfunction (FIG. 18) and a drop in IDCPS1 from 5 A to 0 A in 10 milliseconds after malfunction (FIG. 19). The third statistical moment of VDCPS1 (fVDCPS1) and IDCPS1 (fIDCPS1) are provided herein to detects the loss of input power at power supply 1605 in about 300 microseconds, as depicted in FIGS. 20 and 21, respectively.

As described herein, the detection, identification as well as diagnosis of at least one fault or from at least failure from one or more devices in a system is provided. As described, the detection and identification prevents escalation of such a fault or failure that would otherwise occur had there been a continued operation of a controller of the system without the knowledge of the fault or failure. Failure mode information derived from the system as provided herein is especially critical for isolation of the fault and/or reconfiguration of safety critical systems and helps ensure sustainable operation and safety of the system.

As described herein, fault in a system is detected and diagnosed fast enough prior to a failure or a cascading fault event of a device or system. Converter system port parameters (e.g., current and voltage) are used to detect, identify, and/or control the nature of a fault or failure using existing devices in the system. No additional devices: are needed. The fault/diagnosis routines provided herein are computationally cooperative with existing systems thus enabling such computations to be performed on-chip without requiring additional materials and/or hardware.

Additional objects, advantages and novel features of the invention as set forth in the description, will be apparent to one skilled in the art after reading the foregoing detailed description or may be learned by practice of the invention. The objects and advantages of the invention may be realized and attained by means of the instruments and combinations particularly pointed out here.

What is claimed is:

1. A method for detecting a fault in a power converter system comprising:
   monitoring continuously an output parameter at the power converter and acquiring the output parameter in the form of a signal; and
   processing the signal by determining at least one statistical moment of a sampled window of the output parameter, wherein the at least one statistical moment is expressed as an nth order moment and n is an odd number greater than 3.

2. The method of claim 1, wherein processing provides information on the direction of variation of the signal represented by a cross-variance matrix expression for the nth order moment.

3. The method of claim 2, wherein the output parameter is selected from the group consisting of output current, output voltage and combinations thereof.

4. The method of claim 1, wherein the at least one statistical moment is a third statistical moment of a measured signal from the power converter.

5. The method of claim 4, wherein the third statistical moment is represented by the group consisting of load voltage, load current, source voltage and source current.

6. The method of claim 1, wherein the method further comprises a map of possible conditions of a measured output signal and a third moment of the measured signal.

7. The method of claim 1, wherein the nth order moment is expressed as a mean of a moving sampled window signal measure compared with a current signal measure as defined in a known window size.

8. The method of claim 1, wherein the method provides information about the location of the fault.

9. The method of claim 1, wherein the method detects the fault in milliseconds.

10. The method of claim 1, wherein the output parameter is measured from a sensor.

11. A system for detecting a fault in a converter system comprising:
    a power converter system;
    a means for monitoring continuously an output parameter at the power converter and acquiring the output parameter in the form of a signal; and
    a means for processing the signal by determining at least one statistical moment of a sampled window of the output parameter, wherein the at least one statistical moment is expressed as an nth order moment and n is an odd number greater than 3.

12. The system of claim 11, wherein the output parameter is measured from a sensor selected from the group consisting of current sensor, voltage sensor and combinations thereof.

13. The system of claim 11, wherein the at least one statistical moment is a mean of a moving sampled window measure as compared with a current measure from a defined sample window size.

14. The system of claim 11, wherein the power converter is in operable communication with a computation device.

15. The system of claim 11, wherein processing provides information on the direction of variation of the signal represented by a cross-variance matrix expression for an nth order moment, wherein n is 3 or greater and an odd number.

16. The system of claim 11, wherein the nth order moment is expressed as a mean of a moving sampled window measure compared with a current measure as defined in a known window size.

17. A method for detecting a fault in a power converter system comprising:
representing the fault by a cross-variance matrix of nth order statistical moments of one or more power converter parameters, wherein n is 3 or greater, wherein each parameter is sampled in a common window for determining a statistical moment and one or more parameters are selected from the group consisting of load voltage, load current, source voltage and source current and are acquired and processed as separate signals.

18. A vehicle for detecting a fault in a power converter system comprising:
a vehicle
a power converter operable to drive the vehicle; and
a fault detection system operable with the power converter, wherein the fault detection system continuously monitors one or more output parameters of the power converter and represents the fault by a cross-variance matrix of nth order statistical moments of the one or more output parameters, wherein n is 3 or greater, and wherein each parameter is selected from the group consisting of voltage and current, sampled from a known window and acquired and processed as a separate signal.

19. A system for detecting a fault in a converter system comprising:
a power converter system;
a sensor for acquiring continuously as a signal an output parameter of the power converter; and
a processor for processing the output parameter by determining at least one statistical moment of the output parameter from a sampled window, wherein the at least one statistical moment is expressed as an nth order moment and n is greater than 3.

20. The system of claim 19, wherein the output parameter is in the form of voltage, current, and combinations thereof.

21. The system of claim 19, wherein the at least one statistical moment is represented in a cross-variance matrix for all output parameters.

* * * * *